United States Patent
Lu et al.

(10) Patent No.: US 11,115,019 B2
(45) Date of Patent: Sep. 7, 2021

(54) DYNAMIC SHORT CIRCUIT PROTECTION

(71) Applicant: Ford Global Technologies, LLC, Dearborn, MI (US)

(72) Inventors: Xi Lu, Northville, MI (US); Chingchi Chen, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 818 days.

(21) Appl. No.: 15/917,476

(22) Filed: Mar. 9, 2018

(65) Prior Publication Data

US 2019/0280686 A1   Sep. 12, 2019

(51) Int. Cl.
*H02H 7/00* (2006.01)
*H03K 17/082* (2006.01)
*H03K 5/24* (2006.01)

(52) U.S. Cl.
CPC .......... *H03K 17/0828* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 6,104,149 A | 8/2000 | Pelly | |
| 6,271,708 B1* | 8/2001 | Hoshi | H03K 17/164 327/377 |
| 8,203,377 B2* | 6/2012 | Kelley | H03K 17/04123 327/427 |
| 9,007,102 B2 | 4/2015 | Lobsiger et al. | |
| 9,225,161 B2 | 12/2015 | Wu et al. | |
| 2016/0028377 A1* | 1/2016 | Kandah | G01R 19/165 324/713 |
| 2016/0336936 A1 | 11/2016 | Ma et al. | |

* cited by examiner

*Primary Examiner* — Stephen W Jackson
(74) *Attorney, Agent, or Firm* — David B. Kelley; Brooks Kushman P.C.

(57) ABSTRACT

Circuitry includes a pair of switches arranged in series, and a gate driver. The gate driver, responsive to a magnitude of current through one of the switches exceeding a threshold, discharges a gate of the one through a first resistor. The gate driver also, responsive to a voltage across a parasitic inductance of the switch becoming zero, discharges the gate through a second resistor but not the first resistor.

11 Claims, 2 Drawing Sheets

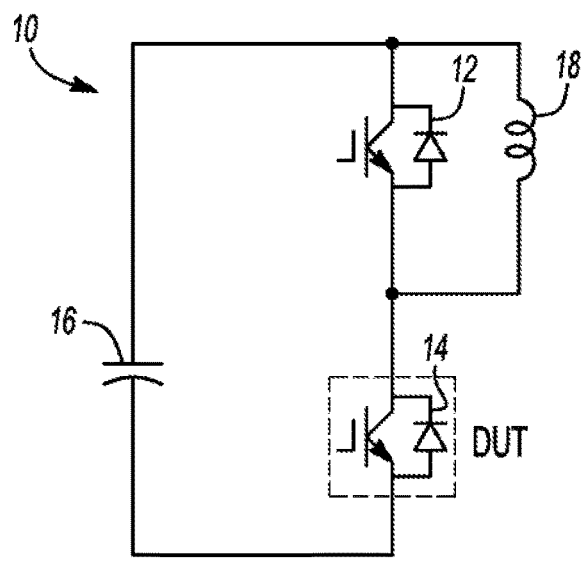
_Fig-1_
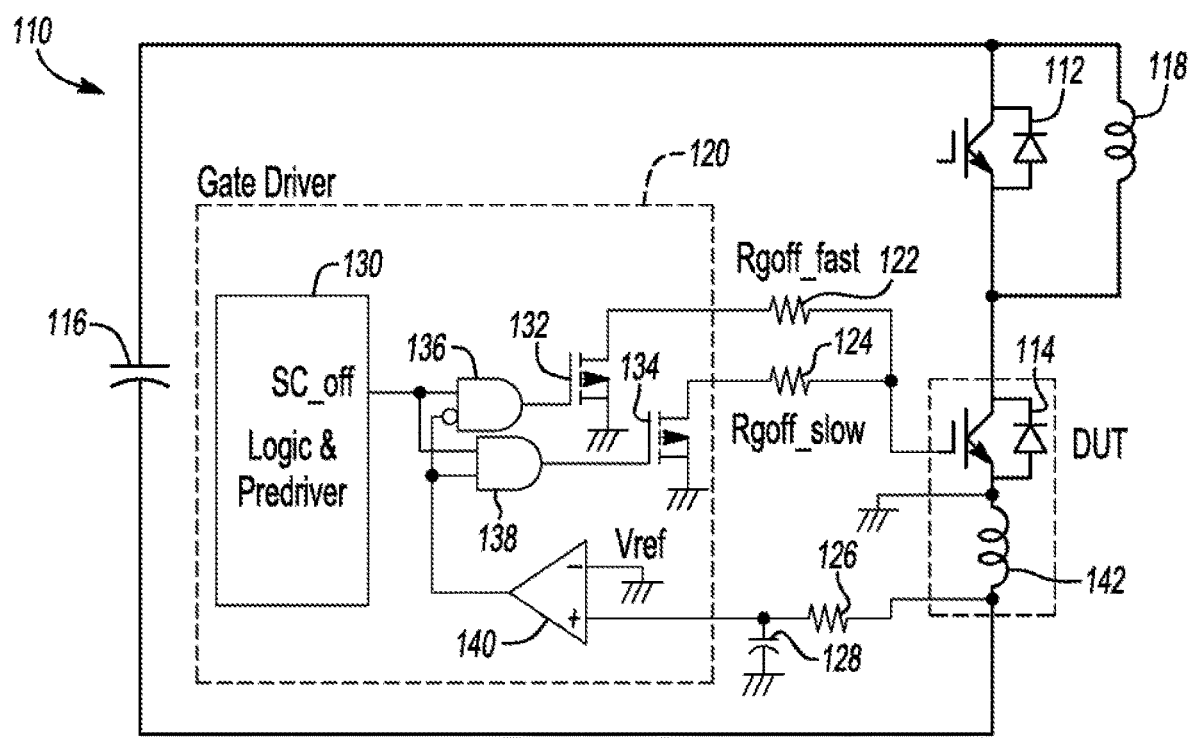
_Fig-2_

DYNAMIC SHORT CIRCUIT PROTECTION

TECHNICAL FIELD

This disclosure relates to switching device short circuit protection techniques.

BACKGROUND

Power switches are widely used in industry. They are commonly used in pairs, and controlled complementarily. Issues such as short circuit events, however, may arise. In these situations, the switches may be subjected to high current, which may exceed the rated current of the switches. Timely high current cut-off can help to mitigate its effects. Otherwise, a temperature rise in the switches may result.

SUMMARY

Circuitry includes a pair of switches arranged in series, and a gate driver. The gate driver, responsive to a magnitude of current through one of the switches exceeding a threshold, discharges a gate of the one through a first resistor, and responsive to a voltage across a parasitic inductance of the switch becoming zero, discharges the gate through a second resistor but not the first resistor. The gate driver may include a comparator arranged to detect the voltage. The gate driver may include logic gates arranged to toggle state responsive to output of the comparator to discharge the gate through the second resistor but not the first resistor. The resistance of the first resistor may be less than a resistance of the second resistor. The switches may be transistors.

A test apparatus includes a pair of complementary-controlled switches, an inductor in parallel with one of the switches, and gate drive circuitry. The gate driver circuitry, responsive to a voltage across a parasitic inductance of the other of the switches becoming zero during a short circuit event, disconnects a gate of the other of the switches from a first resistor and connects the gate to a second resistor to alter a rate of discharge of the gate. The gate drive circuitry may include a comparator arranged to detect the voltage. The gate drive circuitry may include logic gates arranged to toggle state responsive to output of the comparator to disconnect the gate of the other of the switches from the first resistor and connect the gate to the second resistor. A resistance of the first resistor may be less than a resistance of the second resistor. The switches may he transistors. The transistors may be insulated-gate bipolar transistors.

A method for discharging a gate of one of a pair of series connected switches includes responsive to a magnitude of current through one of the switches exceeding a threshold, discharging by a controller a gate of the one through a first resistor, and responsive to a voltage across a parasitic inductance of the switch becoming zero, discharging by the controller the gate through a second resistor but not the first resistor. The method may further comprise detecting by a comparator the voltage. The first resistor may be less than a resistance of the second resistor. The switches may be transistors.

BRIEF DESCRIPTION OF THE DRAWINGS

FIG. 1 is a schematic diagram of a typical double-pulse test circuit.

FIG. 2 is a schematic diagram of a double-pulse test circuit with short circuit protection.

DETAILED DESCRIPTION

Figure 3A:
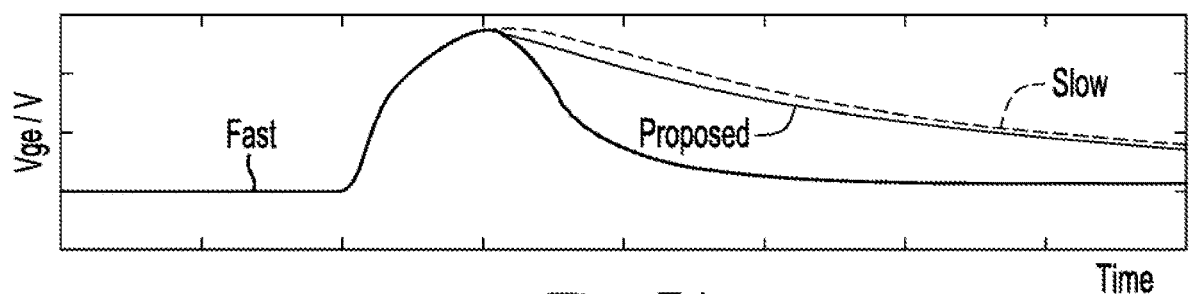
FIG. 3A is a plot of simulated gate-to-emitter voltage versus time for three different gate turn-off and gate capacitor discharge scenarios.

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that arc not explicitly illustrated or described. The combinations of features illustrated provide representative embodiments for typical applications. However, various combinations and modifications of the features consistent with the teachings of this disclosure may be desired for particular applications or implementations.

With reference to FIG. 1, a typical double-pulse test circuit 10 includes a pair of switches 12, 14 (e.g., insulated-gate bipolar transistors (IGBTs)) in series, a capacitor 16 in parallel with the pair, and an inductor 18 in parallel with the switch 12. The circuit 10 may be used to evaluate semiconductor switching performance or gate driver capability. Here, the device under test (DUT) is switch 14.

A short circuit may occur when the dead time is insufficient between the switches 12, 14, or when noise falsely triggers activation of one (or both) of the switches 12, 14 that is otherwise supposed to be off. Either way, when this fault happens, there is a certain period of time when both of the switches 12, 14 are on. This creates the short circuit scenario, leading to a low impedance path across the capacitor 16, and a high current through the switches 12, 14. Hence, circuit protection is functionality often designed into gate drive circuitry. This functionality can entail detecting if the switches 12, 14 are experiencing extremely high current (e.g., several times rated current) and turning the switch 14 off slowly to ensure any voltage spike does not exceed the breakdown voltage of the switch 14.

Several circuit protection methods have been used in industry. Desaturation is one such technique, and has been widely used in past decades. Many commercial gate drivers include this function as a default. If the IGBT turns on into a short circuit, the high current will cause the collector-emitter voltage to rise above $V_{Trip}$ (a preset threshold voltage ~8V) even though the gate of the IGBT is being driven on. This abnormal presence of high Vce, detected by a comparator, when the IGBT is supposed to be on is often called desaturation. Additionally, a delay $t_{Trip}$ is also provided after the comparator output to allow for the normal turn on time of the IGBT. $t_{Trip}$ is set so that the Vce has enough time to fall below $V_{Trip}$ during normal turn on switching.

Some disadvantages include that it requires a long $t_{Trip}$ time (at least 2 µs) before shutting down the faulty device due to the time needed for the device to completely turn on and go into the desaturation region. If $t_{Trip}$ is set too short, erroneous desaturation detection will occur. The short circuit consists of high current with high voltage, leading to high power. The longer the short circuit duration, the higher the energy. If the energy is accumulated to a high value, the IGBT die may experience issues due to high loss/heat. Typically, the maximum safe limit is 10 µs.

Collector current monitoring (current sense/current shunt/current sensor with large fixed-value threshold for protection) is another technique. This method is currently in wide-spread use. Current measurement methods are of various types, such as using current sense integrated on the same die of the IGBT, or using a small current shunt integrated in the busbar. Commercial gate drives associated with collector current monitoring use a fixed-value as the reference to trigger the protection, and then follow with a slow turn off by using a large turn-off gate resistance. This is to ensure that the device will not experience issues at such a high current value, as the turn-off di/dt is maintained to he low enough to avoid overvoltage breakdown.

Relative to the desaturation method, collector current monitoring is a more direct measurement, as it is directly measuring the current, and in most cases, they are quite linear. The desaturation method is indirect, as it measures the IGBT's collector-emitter voltage, which has a non-linear relationship with current.

The collector current measurement method is more accurate than the collector-emitter indication. To avoid miss-triggering, however, the time before turning off the device is long, leading to a high loss (high voltage and high current at the same time). Also, the slow turn off to avoid overvoltage also introduces excess losses.

It is thus desirable to find a simple method to shorten the short circuit protection duration, to reduce the heat/loss generated during this event, and also ensure the semiconductor device is being protected within its acceptable operating region.

With reference to FIG. 2, a double-pulse test circuit 110 includes a pair of switches 112, 114 (e.g., insulated-gate bipolar transistors (IGBTs)) in series, a capacitor 116 in parallel with the pair, and an inductor 118 in parallel with the switch 112. The circuit 110 also includes a gate driver 120, resistors 122, 124, 126, and capacitor 128. The resistance of the resistor 122 is much less than the resistance of the resistor 124. The gate driver 120 includes logic and pre-driver 130, transistors (p-metal-oxide-semiconductor field-effect transistors (p-MOSFETs)) 132, 134, logic gates 136, 138, and comparator 140. The parasitic inductance of the switch 114 is illustrated as numbered element 142.

When the gate driver 120 sends out a turn-on signal to the switch 114, +15V in this example is applied to the gate-emitter thereof through a typical resistor (not shown) having low resistance for optimized switching speed. Therefore, the voltage across the gate-emitter ramps up as the gate capacitor Cge is being charged.

Assuming this is a short circuit event, for example the switch 112 is somehow inadvertently turned on, the collector current of the switch 114 cannot stop at the load current level, but keeps increasing due to the short circuit. Without an adequate solution, the current can reach 5× to 10× of its original rated current. In the following simulation study, the assumed rated current is 300 A. Various methods can be used for detecting the current, such as a shunt resistor, current probe, on-die current sense, and so on. When the current is detected to be larger than, for example, 1200 A (~4×), the gate driver 130 gives a turn-off signal, which means the +15V supply is removed in the usual fashion. The transistors 132, 134 and logic gates 136, 138 are arranged such that the gate capacitor Cge starts to discharge through the resistor 122, and its voltage starts to decrease.

As the gate voltage reduces, di/dt reduces as well. At some point, di/dt reaches 0. This is also when the collector-emitter voltage Vce becomes the same as the DC bus voltage across the capacitor 116. This time instant can be detected by the comparator 140. One input is the ground reference and the other input is the voltage across the sense emitter and power emitter (the parasitic inductance 142. By comparing the voltage across the parasitic inductance 142 (L*di/dt) with ground reference (0), it is relatively easy to determine the time instant when di/dt=0.

Responsive to output by the comparator 140 indicating that di/dt=0, the transistors 132, 134 and logic gates 136, 138 are arranged to automatically switch from the resistor 122 to the resistor 124 to softly and slowly turn off the device. This is to maintain the peak voltage overshoot within the acceptable operating region. This is simpler and more accurate than other possible techniques that may attempt to monitor the gate-emitter voltage Vge, and automatically switch from one resistor to another responsive to the Vge becoming less than some calibrated threshold.

FIGS. 3A through all show traces of gate-to-emitter voltage, device current, collector-to-emitter voltage, and loss consumed by the device respectively versus time for three scenarios: (1) gate turn-off and gate capacitor discharge through resistor 122 only (labelled "Fast"), (2) gate turn-off and gate capacitor discharge through resistor 124 only (labelled "Slow"), and (3) gate turn-off and gate capacitor discharge first through resistor 122 and then resistor 124 as described above (labelled "Proposed").

With reference to FIG. 3A, exclusive discharge through the resistor 122 only (the "Fast" scenario) results in the quickest reduction in gate-to-emitter voltage as expected. Exclusive discharge through the resistor 124 only (the "Slow" scenario) and through the resistor 122 then the resistor 124 (the "Proposed" scenario) results in more steady reductions in gate-to-emitter voltage relatively speaking.

Figure 3B:
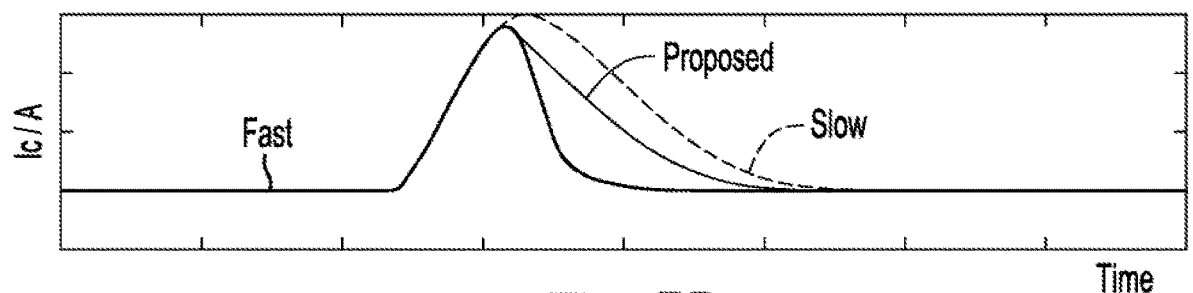
FIG. 3B is a plot of simulated device current versus time for the three diff rent gate turn-off and gate capacitor discharge scenarios of FIG. 3A.

With reference to FIG. 3B, the "Fast" scenario results in the quickest reduction in device current as expected. The "Slow" scenario results in the highest peak device current and slowest reduction in device current—again as expected. The "Proposed" scenario results in a peak device current less than the "Slow" scenario, and a rate of reduction in device current greater than the "Slow" scenario but Less than the "Fast" scenario.

Figure 3C:
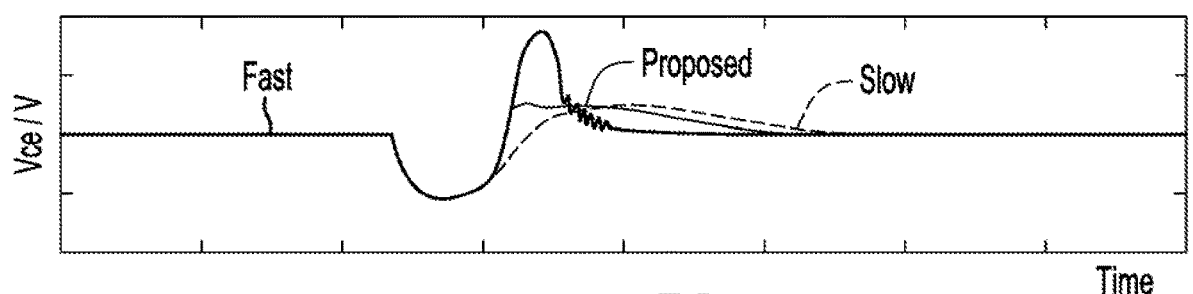
FIG. 3C is a plot of simulated collector-to-emitter voltage versus time for the three different gate turn-off and gate capacitor discharge scenarios of FIG. 3A.

With reference to FIG. 3C, all three scenarios exhibit similar drops in collector-to-emitter voltage prior to increase. The "Fast" scenario, however, results in the greatest overshoot. Hence, there is a trade-off between the rate of reduction in gate-to-emitter voltage and collector-to-emitter voltage overshoot. Such overshoot, in certain situations, may exceed device capabilities. As such, the "Proposed" scenario strikes a balance between collector-to-emitter voltage overshoot and rates of reduction in gate-to-emitter voltage and device current relative to the "Fast'" and "Slow" scenarios.

Figure 3D:
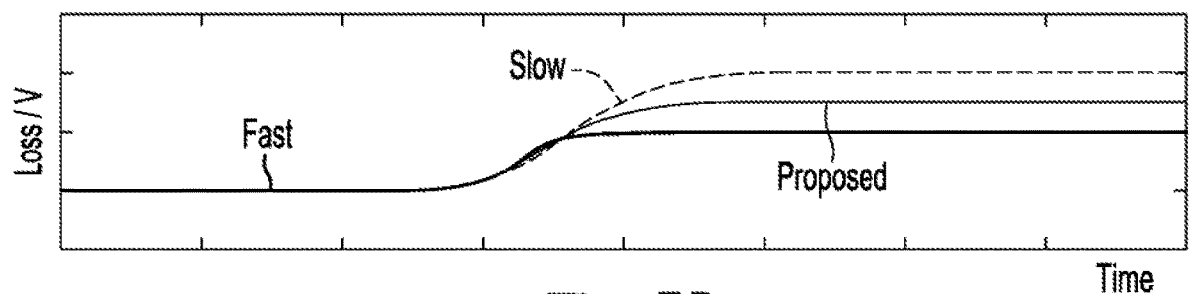
FIG. 3D is a plot of simulated device under test loss versus time for the three different gate turnoff and gate capacitor discharge scenarios.

With reference to FIG. 3D, the "Fast" scenario results in the least loss consumed by the device as expected. The "Slow" scenario results in the greatest loss consumed by the device—again as expected. The "Proposed" scenario results in a loss greater than the "Fast" scenario but less than the "Slow" scenario.

The processes, methods, logic, or strategies disclosed may be deliverable to and/or implemented by a processing device, controller, or computer, which may include any existing programmable electronic control unit or dedicated electronic control unit. Similarly, the processes, methods, logic, or strategies may be stored as data and instructions executable by a controller or computer in many forms including, but not limited to, information permanently stored on various types of articles of manufacture that may include persistent non-writable storage media such as ROM devices, as well as information alterably stored on writeable storage media such as floppy disks, magnetic tapes, CDs, RAM devices, and other magnetic and optical media. The processes, methods, logic, or strategies may also be implemented in a software executable object. Alternatively, they may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure and claims. For example, the shot circuit protection architectures contemplated herein were explained with reference to double pulse test circuitry. Such circuitry, however, is not the only forum for implementation. The proposed embodiments may, for example, be used in conjunction with paired power switches of automotive power electronics modules for short circuit protection, or other components as desired. And although a comparator, logic gates, and transistors were used in the example of FIG. 2 to detect a voltage across a parasitic inductance and change gate connections from one resistor to another, any suitable circuitry or set-up may he used. Other arrangements are also contemplated, etc.

As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. Circuitry comprising:
a pair of switches arranged in series; and
a gate driver configured to
responsive to a magnitude of current through one of the switches exceeding a threshold, discharge a gate of the one through a first resistor, and
responsive to a voltage across a parasitic inductance of the one becoming zero, discharge the gate through a second resistor but not the first resistor,
wherein the gate driver includes a comparator arranged to detect the voltage.

2. The circuitry of claim 1, wherein the gate driver includes logic gates arranged to toggle state responsive to output of the comparator to discharge the gate through the second resistor but not the first resistor.

3. The circuitry of claim 1, wherein a resistance of the first resistor is less than a resistance of the second resistor.

4. The circuitry of claim 1, wherein the switches are transistors.

5. A test apparatus comprising:
a pair of complementary-controlled insulated-gate bipolar transistors;
an inductor in parallel with one of the insulated-gate bipolar transistors; and
gate drive circuitry configured to, responsive to voltage across a parasitic inductance of the other of the insulated-gate bipolar transistors becoming zero during a short circuit event, disconnect a gate of the other of the insulated-gate bipolar transistors from a first resistor and connect the gate to a second resistor to alter a rate of discharge of the gate.

6. The apparatus of claim 5, wherein the gate drive circuitry includes a comparator arranged to detect the voltage.

7. The apparatus of claim 6, wherein the gate drive circuitry includes logic gates arranged to toggle state responsive to output of the comparator to disconnect the gate of the other of the insulated-gate bipolar transistors from the first resistor and connect the gate to the second resistor.

8. The apparatus of claim 5, wherein a resistance of the first resistor is less than a resistance of the second resistor.

9. A method for discharging a gate of one of a pair of series connected switches, comprising:
responsive to a magnitude of current through the one of the switches exceeding a threshold, discharging by a controller a gate of the one through a first resistor, and
responsive to a voltage across a parasitic inductance of the one becoming zero, discharging by the controller the gate through a second resistor but not the first resistor, wherein a resistance of the first resistor is less than a resistance of the second resistor.

10. The method of claim 9 further comprising detecting by a comparator the voltage.

11. The method of claim 9, wherein the switches are transistors.

* * * * *